United States Patent [19]

Nakayama et al.

[11] Patent Number: 4,903,236

[45] Date of Patent: Feb. 20, 1990

[54] NONVOLATILE SEMICONDUCTOR MEMORY DEVICE AND A WRITING METHOD THEREFOR

[75] Inventors: Takeshi Nakayama; Kazuo Kobayashi; Yasushi Terada, all of Hyogo, Japan

[73] Assignee: Mitsubishi Denki Kabushiki Kaisha, Tokyo, Japan

[21] Appl. No.: 156,431

[22] Filed: Feb. 16, 1988

[30] Foreign Application Priority Data

Jul. 15, 1987 [JP] Japan .............................. 62-177715
Aug. 5, 1987 [JP] Japan .............................. 62-196825

[51] Int. Cl.$^4$ .............................................. G11C 11/40
[52] U.S. Cl. ..................................... 365/185; 365/218
[58] Field of Search ............... 365/182, 185, 189, 104, 365/218; 357/23.5

[56] References Cited

U.S. PATENT DOCUMENTS 4,377,857 3/1983 Tickle .................................. 365/185
4,727,515 2/1988 Hsu ..................................... 365/185

Primary Examiner—Joseph A. Popek
Attorney, Agent, or Firm—Lowe, Price, LeBlanc, Becker & Shur

[57] ABSTRACT

In an erase mode, a high DC voltage Vpp is applied to all of the word lines and zero volt is applied to all of the bit lines, whereby the contents of all of the memory transistors are simultaneously erased. In a write mode, which constitutes an essential feature of the present invention, zero volt is applied to a selected word line and the high DC voltage Vpp is applied to a selected bit line, with an intermediate voltage ½·Vpp being applied to the other word lines and bit lines. Thus, by electron tunneling, data is written in a memory transistor located at a point of intersection between the selected word line and the selected bit line.

18 Claims, 9 Drawing Sheets

NONVOLATILE SEMICONDUCTOR MEMORY DEVICE AND A WRITING METHOD THEREFOR

BACKGROUND OF THE INVENTION

1. Field of the Invention

The present invention relates generally to a nonvolatile semiconductor memory device and a writing method therefor, and more particularly to a nonvolatile semiconductor memory device capable of electrically rewriting information and a writing method therefor.

2. Description of the Prior Art

FIG. 1 is a circuit diagram showing a portion of a memory cell array of a conventional nonvolatile semiconductor memory device, such as an electrically erasable programmable read-only memory (EEPROM), together with voltages for writing and erasing at electrodes, as disclosed in the Digest of Technical Papers, pp. 76–77 of International Solid State Circuits Conference (IEEE), 1987.

Referring to FIG. 1, memory transistors Q1 to Q4 are MOS transistors each provided with a floating gate, and each forming one memory cell. The memory transistors are arrayed in a matrix and the respective source electrodes thereof are connected with a source line SL common to all the cells. A bit line connects the drain electrodes of the memory transistors in the same column. FIG. 1 shows two bit lines BL1 and BL2. A word line connects the control gates of the memory transistors in the same row. FIG. 1 shows two word lines WL1 and WL2. Although FIG. 1 shows four memory transistors Q1–Q4, a memory cell array usually comprises a larger number of memory transistors.

FIG. 2 is a sectional view of a structure of a conventional memory transistor used in the nonvolatile semiconductor memory device shown in FIG. 1. Referring to FIG. 2, a drain region 6 and a source region 7 are formed with a prescribed spacing on a surface of a semiconductor substrate 5. A floating gate 9 is formed on a surface region of the semiconductor substrate 5 near the drain region 6 through a thin oxide film 8 of about 200 Å. The floating gate 9 is in an electrically floating state and part of the gate 9 is located opposite the drain region 6. A control gate 10 of polysilicon is formed on the floating gate 9 through an oxide film. The control gate 10 extends near the source region 7 so that a selector gate is integrally formed. The drain region 6, the control gate 10 and the source region 7 include a drain electrode 11, a control electrode 12 and a source electrode 13, respectively. The bit line BL1 or BL2 shown in FIG. 1 is connected to the drain electrode 11; the word line WL1 or WL2 is connected to the control electrode 12; and the source line SL is connected to the source electrode 13.

Operation of the conventional device shown in FIGS. 1 and 2 will now be described. In this conventional device, "1" is written in all the memory cells in an erase mode and "0" is written only in any memory cell where the data is to be written in a write mode.

First, erasing operation will be described. When all the bit lines BL1, BL2 etc. are supplied with a high voltage Vpp with all the word lines WL1, WL2 etc. being at zero volt, a high field is generated between the floating gate 9 and the drain region 6 shown in FIG. 2. Thus, electrons stored in the floating gate 9 are drawn into the drain region 6 through the thin oxide film 8 by electron tunneling. At this time, the floating gate 9 is depleted of electrons and accordingly a threshold voltage of the memory transistor viewed from the control gate 10 is lowered compared with that before the erasing operation. This state is referred to as an erase state and a logic "1" is assigned to that state.

As to writing operation, the case of writing in the memory transistor Q3 will be particularly described. Writing procedures are the same as those in a program in an EPROM (Electrically Programmable ROM). Voltages are applied in the following manner. The selected bit line BL2 is at Vpp; the non-selected bit line BL1 is at zero volt; the selected word line WL1 is at Vpp; the non-selected word line WL2 is at zero volt; and the common source line SL is at zero volt. Consequently, hot electrons are generated in the vicinity of the drain region 6 of the memory transistor Q3 and those hot electrons are accelerated by the high voltage Vpp applied to the control gate 10 so as to be introduced into the floating gate 9. As a result, electrons are stored in the floating gate 9 and the threshold voltage of the memory transistor viewed from the control gate 10 becomes higher than that prior to the writing operation. Thus, a write state is established and a logic "0" is set.

In the above described conventional device, it is not necessary to erase stored information by using ultraviolet rays, because like an EPROM stored information can be electrically erased with the device being mounted on a board. In addition, a memory cell of the above described conventional device can be formed by a single transistor, not by two transistors as in an EEPROM, and thus chip area can be reduced.

However, if writing operation is to be performed as described above in the conventional nonvolatile semiconductor memory device by injection of hot electrons, it is necessary to provide a power supply having a large current driving capacity. If a high voltage developed by an internal power supply of the device is utilized, the current driving capacity is small and writing operation cannot be performed in a satisfactory manner. Accordingly, the conventional device requires an external power supply having a large current driving capacity. Thus, an external power supply is provided in the conventional device for satisfactorily performing operation in addition to an internal power supply, which causes the circuit connected with the device to be large in size, resulting in considerable increase of the manufacturing cost. In addition, writing operation by injection of hot electrons produces an excessively large quantity of electrons in the thin oxide film 8, causing deterioration of the thin oxide film 8. As a result, the number of erasing and writing operations effectively performed is considerably decreased (to about $10^3$).

FIG. 3 is a diagram for explaining a writing method of an integrally formed type nonvolatile memory cell matrix disclosed in Japanese Patent Laying-Open Gazette No. 99997/1986. According to this gazette, in the write mode, a high voltage Vpp is applied to the bit line BL2 related to the selected memory transistor Q3 with the other bit lines being at zero volt and zero volt is applied to the word line WL1 related to the selected memory transistor Q3 with an intermediate voltage $\frac{1}{2}$·Vpp being applied to the other word lines. In the above described writing method, a high field is generated between the floating gate and the drain region of the selected transistor Q3, making it possible to write information by electron tunneling. Thus, the above described writing method appears to be able to eliminate the above described disadvantages of the conventional device shown in FIG. 1. However, in the writing method in FIG. 3, both of the memory transistors Q2 and Q4 are turned on and current leakage paths as shown by the arrows in FIG. 3 are formed. As a result, large current flows from the power supply generating the high voltage Vpp to be applied to the bit line BL2, to ground. Consequently, a power supply having a large current driving capacity needs to be used as the power supply for generating the high voltage Vpp, and an internal power supply accordingly cannot be used. Therefore, the writing method shown in FIG. 3 also requires an external power supply, which involves the disadvantage that the circuit is large in size and expensive.

SUMMARY OF THE INVENTION

The present invention has been accomplished to overcome the above described various disadvantages of the prior art. Therefore, it is an object of the present invention to provide a nonvolatile memory device and a writing method therefor, by which operation can be performed by only an internally incorporated power supply and the number of erasing and writing operations can be considerably increased compared with the prior art.

Briefly stated, according to the present invention, voltages are applied in the below described manner in a writing cycle. A ground voltage is applied to a word line selected for writing; a high DC voltage is applied to a bit line selected for writing; and an intermediate voltage higher than the ground voltage and lower than the high DC voltage is applied to the other non-selected word lines and the other non-selected bit lines.

According to the present invention, writing in a selected memory cell is performed by electron tunneling and current leakage paths as in the conventional device can be prevented. As a result, operation can be performed only by an internal power supply without using an external power supply, which makes it possible to reduce the size of a device and to lower the manufacturing cost thereof. In addition, memory cells are less deteriorated and accordingly the number of possible writing operations can be increased compared with a conventional nonvolatile semiconductor memory device.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
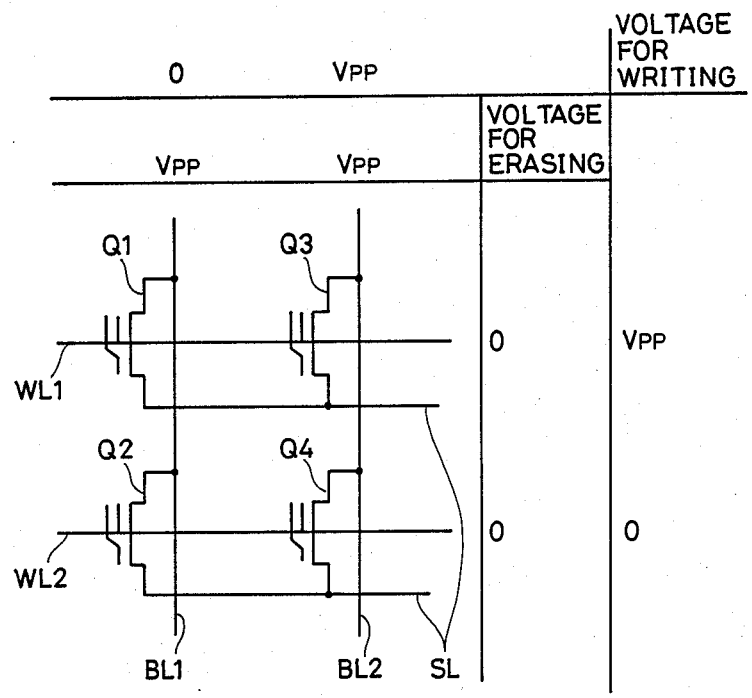
FIG. 1 is a diagram showing a circuit configuration of part of a memory cell array of a conventional nonvolatile semiconductor memory device and also showing voltages for writing and erasing to be applied to the electrodes.
Figure 4:
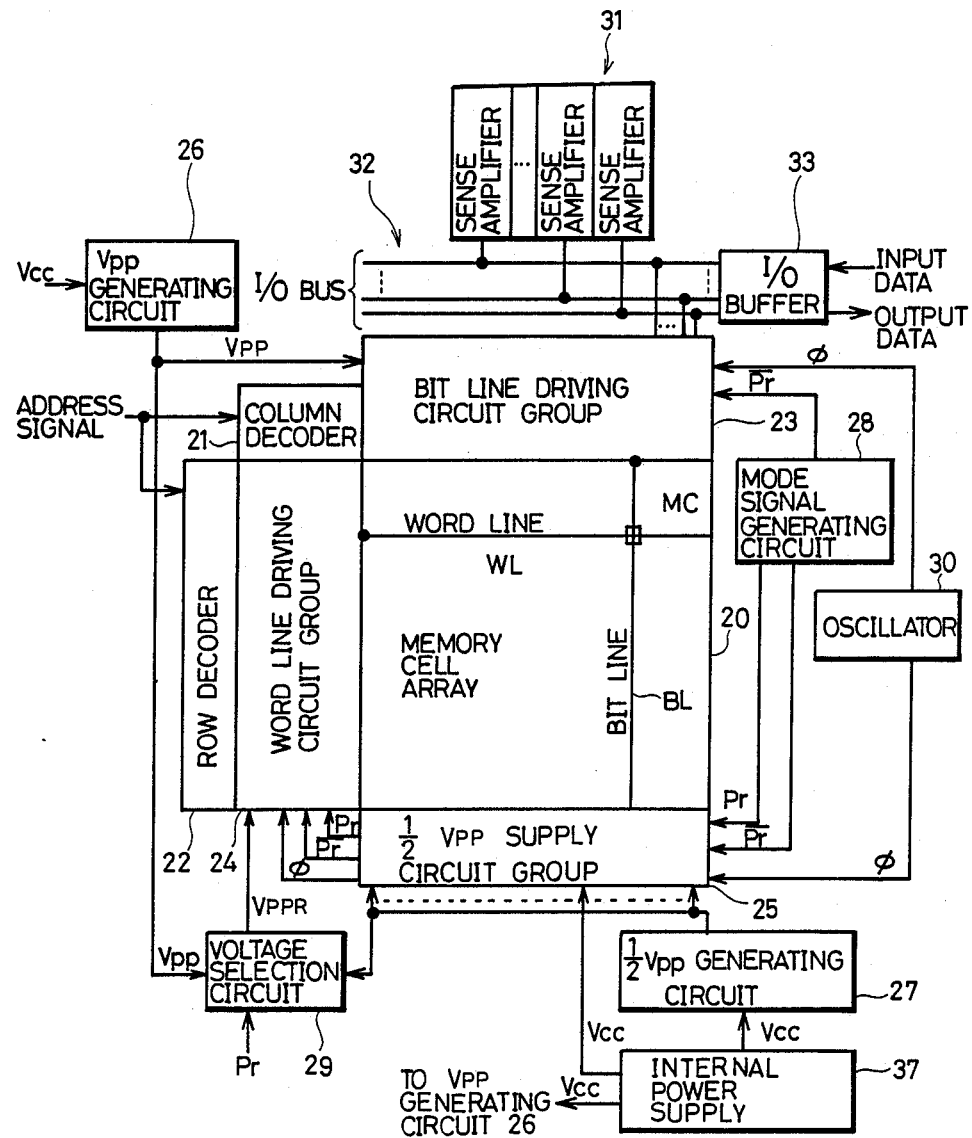
FIG. 4 is a block diagram showing an embodiment of the present invention.
Figure 5:
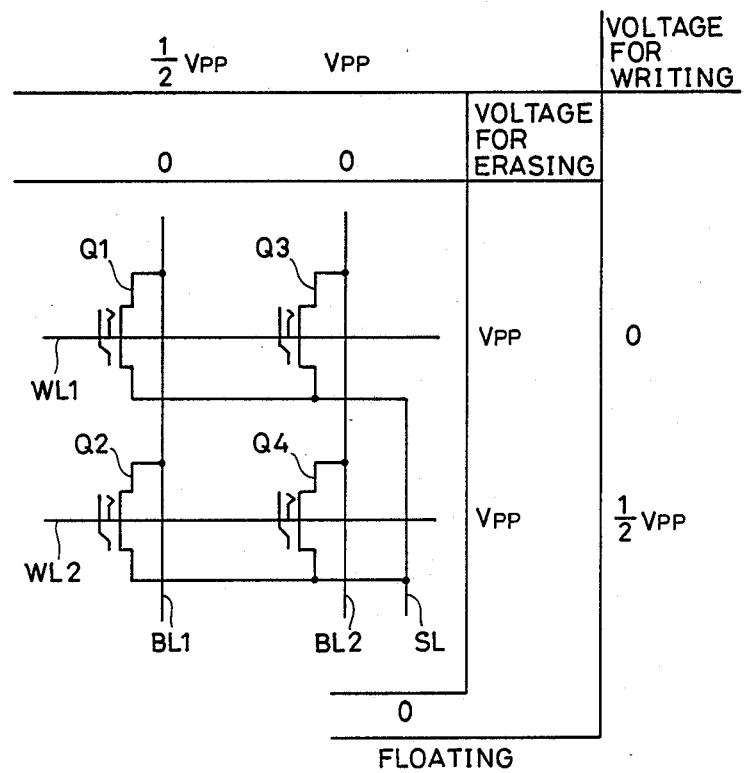
FIG. 5 is a diagram showing a circuit configuration of part of the memory cell array 20 shown in FIG. 4, as well as voltages for writing and erasing to be applied to the electrodes.

FIG. 4 is a schematic block diagram of an embodiment of the present invention. The construction shown in FIG. 4 is all mounted on a single chip of a semiconductor integrated circuit. A memory cell array 20 comprises a plurality of memory cells MC arranged in a matrix. More specifically, the memory cell array 20 includes a plurality of word lines WL and a plurality of bit lines BL orthogonally intersecting with the word lines WL, and a memory cell MC is provided at each point of intersection of a word line WL and a bit line BL. FIG. 5 is a circuit diagram showing part of the memory cell array 20. The circuit configuration shown in FIG. 5 is similar to that of the conventional nonvolatile semiconductor memory device shown in FIG. 1, except that voltages applied to the word lines and the bit lines in each operation mode are different from those in the conventional device, as described afterwards.

A column decoder 21 (FIG. 4) is a circuit for selecting a bit line BL in response to an address signal and the number of output lines thereof corresponds to the number of the bit lines BL. A row decoder 22 is a circuit for selecting a word line WL in response to an address signal and the number of output lines thereof corresponds to the number of the word lines WL.

A bit line driving circuit group 23 comprises a plurality o bit line driving circuits provided corresponding to the respective bit lines BL and it applies predetermined voltages to the bit lines BL dependent on an operation mode. A word line driving circuit group 24 comprises a plurality of word line driving circuits provided corresponding to the respective word lines WL and it applies predetermined voltages to the word lines WL dependent on an operation mode.

A $\frac{1}{2}$.Vpp supply circuit group 25 comprises a plurality of $\frac{1}{2}$.Vpp supply circuits provided corresponding to the respective bit lines BL and it applies an intermediate voltage $\frac{1}{2}$.Vpp to all of the bit lines BL in the write mode. An internal power supply circuit 37 generates a constant DC voltage Vcc (e.g. 5V). An output of the internal power supply circuit supply 37 is supplied to various circuits in the semiconductor integrated circuit chip.

A Vpp generating circuit 26 and a $\frac{1}{2}$.Vpp generating circuit 27 raise the output voltage Vcc of the internal power supply circuit 37 and generate a positive high DC voltage Vpp (e.g. 16 to 20V) and an intermediate voltage $\frac{1}{2}$.Vpp, respectively. The voltage $\frac{1}{2}$.Vpp is about half of Vpp. An output of the Vpp generating circuit 26 is supplied to the bit line driving circuit group 23, while an output of the $\frac{1}{2}$.Vpp generating circuit 27 is supplied to the $\frac{1}{2}$.Vpp supply circuit group 25.

A mode signal generating circuit 28 is a circuit for generating mode signals Pr and $\overline{Pr}$ indicating whether the write mode is selected or not in response to an instruction from a CPU or the like (not shown). The mode signals Pr and $\overline{Pr}$ are complementary signals. More specifically, in the write mode, the mode signal Pr is at an H level and the mode signal $\overline{Pr}$ is at an L level, while in other modes, the mode signal Pr is at the L level and the mode signal $\overline{Pr}$ is at the H level. The mode signals Pr and $\overline{Pr}$ are supplied to the word line driving circuit group 24 and the ½.Vpp supply circuit group 25. The mode signal $\overline{Pr}$ is singly supplied to the bit line driving circuit group 23.

A voltage selection circuit 29 selects the output voltage Vpp from the Vpp generating circuit 26 or the output voltage ½.Vpp from the ½.Vpp generating circuit 27 in response to the mode signal Pr from the mode signal generating circuit 28 and supplies the selected voltage to the word line driving circuit group 24. An oscillator 30 generates clock pulses $\phi$, which are supplied to the bit line driving circuit group 23, the word line driving circuit group 24 and the ½.Vpp supply circuit group 25.

A sense amplifier group 31 comprises a plurality of sense amplifiers provided corresponding to the respective bit lines BL and it detects and amplifies electric charge read out on the bit lines. Each sense amplifier is connected to the corresponding bit line driving circuit of the bit line driving circuit group 23 through an I/O bus 32 and is also connected to an I/O buffer 33.

Figure 6:
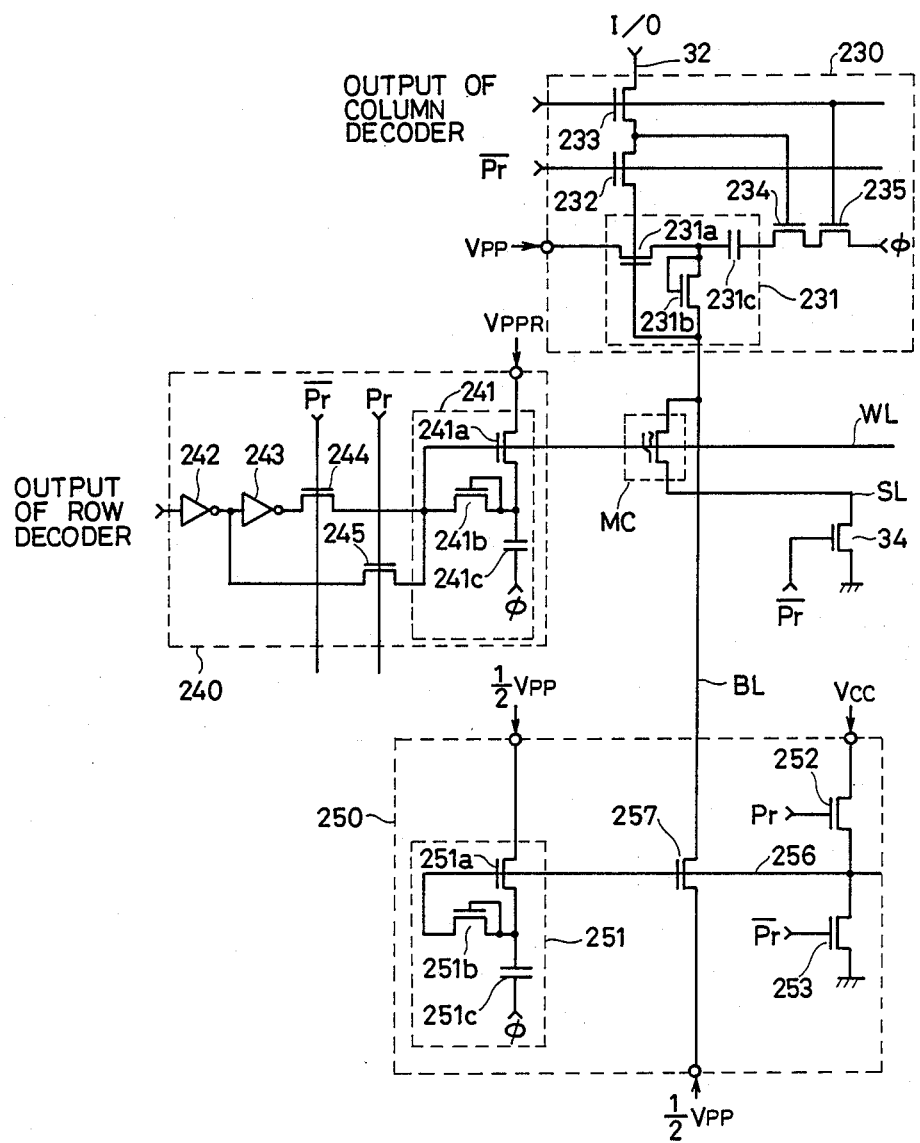
FIG. 6 is a diagram showing details of a circuit related to a memory cell MC shown in FIG. 4.

FIG. 6 is a circuit diagram showing a relation of a memory cell MC to a bit line driving circuit 230 of the bit line driving circuit group 23, a word line driving circuit 240 of the word line driving circuit group 24 and a ½.Vpp supply circuit 250 of the ½.Vpp supply circuit group 25 shown in FIG. 4.

Referring to FIG. 6, the bit line driving circuit 230, the word line driving circuit 240 and the ½.Vpp supply circuit 250 include DC voltage switches 231, 241 and 251, respectively, having the same construction. Those DC voltage switches 231, 241 and 251 have a function of switching input voltage dependent on the H or L level of an input signal.

The DC voltage switch 231 has the function of switching the high DC voltage Vpp applied from the Vpp generating circuit 26, dependent on the H or L level of the input signal, and an output of the DC voltage switch 231 is supplied to the corresponding bit line BL. The input signal to the DC voltage switch 231 is supplied from the corresponding I/O line in the I/O bus 32 through N channel MOS transistors (hereinafter referred to as NMOS transistors) 232 and 233 for example. The DC voltage switch 231 receives clock pulses $\phi$ from the oscillator 30 through NMOS transistors 234 and 235. Gates of the NMOS transistors 233 and 235 receive an output of the column decoder 21. A gate of the NMOS transistor 232 receives the mode signal $\overline{Pr}$ from the mode signal generating circuit 28. A gate of the NMOS transistor 234 is connected to a point of connection between the NMOS transistors 232 and 233.

The DC voltage switch 241 has the function of switching the DC voltage Vpp$_R$ (Vpp or ½.Vpp) applied from the voltage selection circuit 29, dependent on the H or L level of the input signal and an output of the DC voltage switch 241 is supplied to the corresponding word line WL. The input signal to the DC voltage switch 241 is formed by means of inverters 242, 243, NMOS transistors 244 and 245. The inverter 242 receives an output of the row decoder 22 and supplies an output to the inverter 243. The NMOS transistors 244 and 245 gate the outputs of the inverters 243 and 242, respectively, and supply the outputs to the DC voltage switch 241 as input signals. The gates of the NMOS transistors 244 and 245 receive the mode signals $\overline{Pr}$ and Pr, respectively, so that the NMOS transistors 244 and 245 are turned on and off in a complementary manner.

The DC voltage switch 251 has the function of switching the DC voltage ½.Vpp applied from the ½.Vpp generating circuit 27, dependent on the H or L level of the input signal. The input signal to the DC voltage switch 251 is formed by means of two NMOS transistors 252 and 253 provided in series between the internal power supply circuit 37 and the ground. The gates of the NMOS transistors 252 and 253 receive the mode signals Pr and $\overline{Pr}$, respectively, so that the NMOS transistors 252 and 253 are turned on and off in a complementary manner. A voltage signal at a point of connection between the NMOS transistors 252 and 253 is inputted to the DC voltage switch 251 through a signal line 256. The signal line 256 is also used as an output signal line of the DC voltage switch 251 and, accordingly, an output of the DC voltage switch 251 is supplied to a gate of an NMOS transistor 257 through the signal line 256. The NMOS transistor 257 is provided between the corresponding bit line BL and the ½.Vpp generating circuit 27.

An NMOS transistor 34 as switching means is provided between the source line SL of the memory cell MC and the ground. The NMOS transistor 34 is turned on and off in response to the mode signal $\overline{Pr}$.

Figure 2:
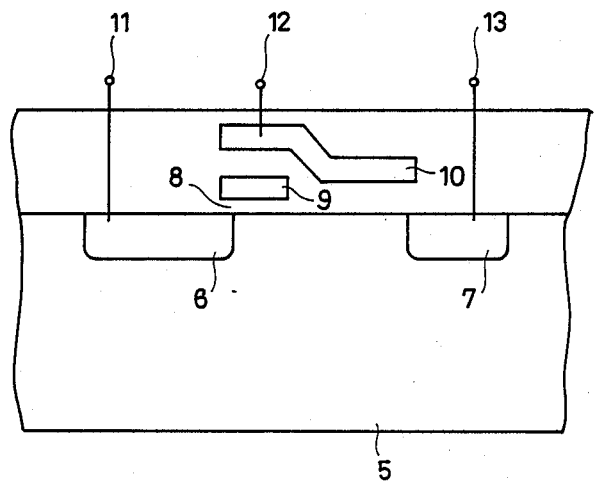
FIG. 2 is a view showing a sectional structure of a memory transistor used in the conventional device shown in FIG. 1.
Figure 7:
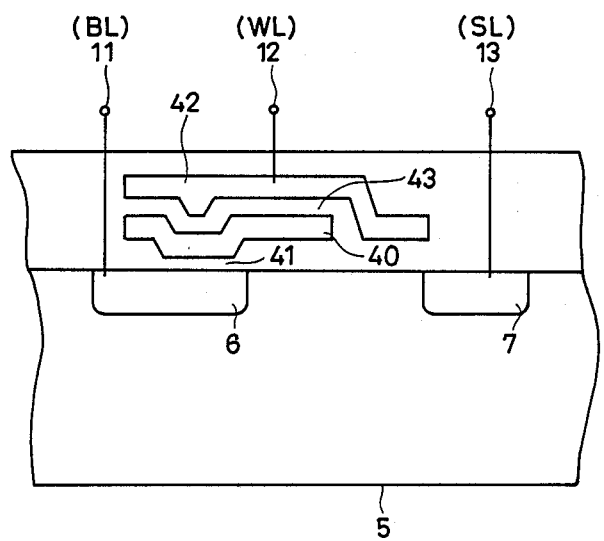
FIG. 7 is a view showing a sectional structure of a memory transistor used in the embodiment shown in FIG. 4.

Although the cell having the structure shown in FIG. 2 may be used as the memory cell MC shown in FIG. 4 (i.e. the memory transistor shown in FIG. 5), a memory cell having the structure shown in FIG. 7 is preferably used.

Referring to FIG. 7, a drain region 6 and a source region 7 are formed with a predetermined spacing on a surface of a semiconductor substrate 5. A floating gate 40 of polysilicon or the like in an electrically floating state is formed on the drain region 6. The floating gate 40 has a depressed portion, which is opposed to the drain region 6 through a thin silicon oxide film 41 of about 100 Å. The thin silicon oxide film 41 serves as a path of tunneling current. A control gate 42 is provided on the floating gate 40 through a silicon oxide film 43. An end of the control gate 42 extends near the source region 7, whereby a selector gate is integrally formed. The drain region 6, the control gate 42 and the source region 7 are provided with a drain electrode 11, a control electrode 12 and a source electrode 13, respectively, in the same manner as in the case of FIG. 2. The drain electrode 11, the control electrode 12 and the source electrode 13 are formed of aluminum for example. The drain electrode 11 is connected to a bit line BL, the control electrode 12 is connected to a word line WL and the source electrode 13 is connected to a source line SL.

Figure 8:
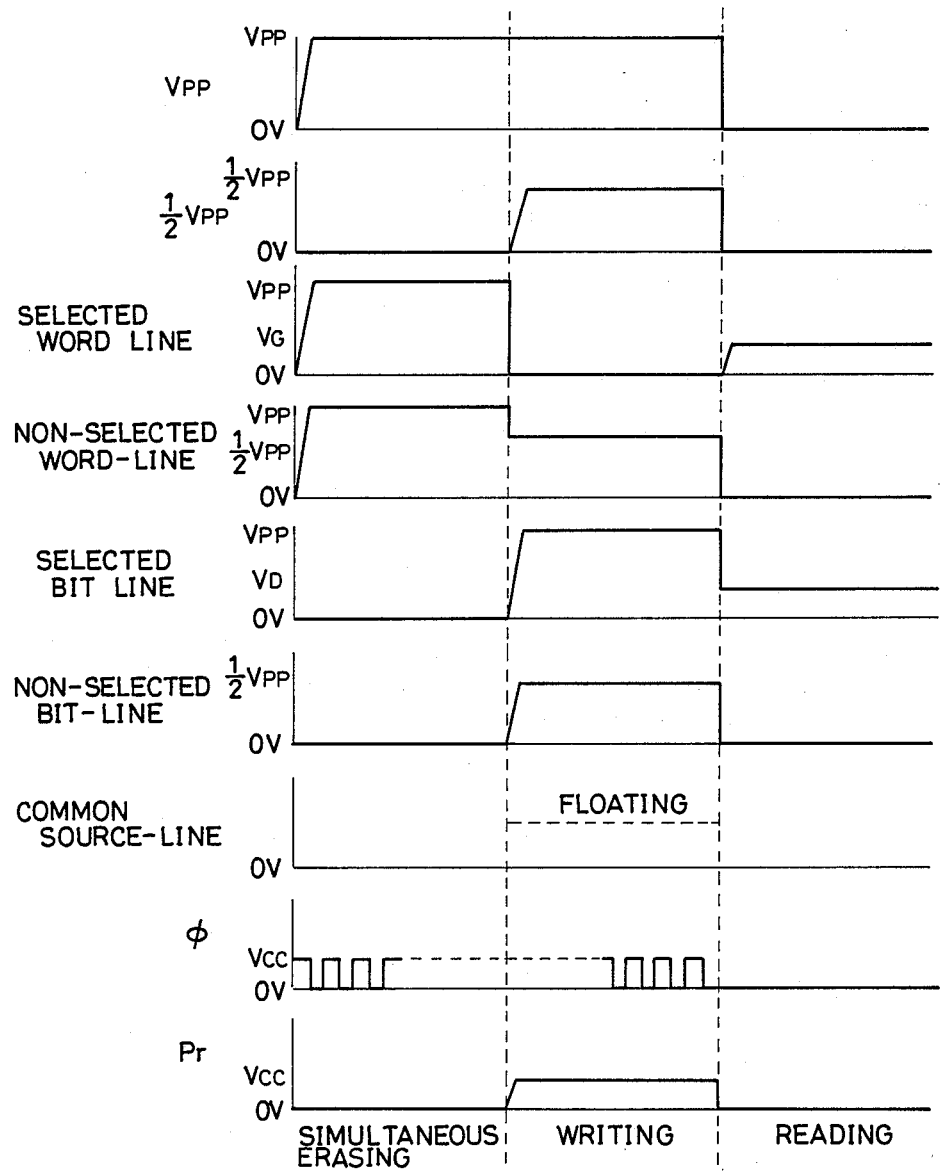
FIG. 8 is a waveform diagram for explaining operation of the embodiment shown in FIGS. 4 to 7.

FIG. 8 shows changes of potentials in the main portions of the embodiment in an erase mode, a write mode and a read mode. In the following, operation of the embodiment shown in FIGS. 4 to 7 will be described referring to FIG. 8. Although a state in which electrons are removed from the floating gate is called an "erase state" and a state in which electrons are injected into the floating gate is called a "write state" in the case of the above described conventional device, those definitions may be reversed. In the embodiment of the present invention, a state in which electrons are injected in the floating gate is defined as an "erase state" and a state in which electrons are removed from the floating gate is defined as a "write state".

Erasing Operation:

Operation in the erase mode will be first described. In this mode, the outputs of the column decoder 21 and the row decoder 22 are all at the H level. Since no data is inputted to the I/O bus 32, the potential thereof is zero volt. The mode signal generating circuit 28 provide the mode signal Pr at the L level and the mode signal $\overline{Pr}$ at the H level. Consequently, the voltage selection circuit 29 selects the output voltage Vpp from the Vpp generating circuit 26 and supplies it to the word line driving circuit group 24.

In the above described state, the NMOS transistors 232, 233 and 235 are turned on and the NMOS transistor 234 is turned off in the bit line driving circuit 230. As a result, clock pulses $\phi$ are not inputted to the DC voltage switch 231 and the input signals from the I/O bus 32 through the NMOS transistors 232 and 233 are all at the L level. Accordingly, the DC voltage switch 231 is not activated and the potential of zero volt of the I/O bus 32 is transmitted directly to the bit lines BL. At this time, since the NMOS transistor 252 is turned off and the NMOS transistor 253 is turned on in the $\frac{1}{2}$.Vpp supply circuit 250, the potential of the signal line 256 is equal to the ground potential, i.e. zero volt and the NMOS transistor 257 is turned off. Consequently, the voltages of all of the bit lines BL are zero volt.

On the other hand, since the NMOS transistor 244 is turned on and the NMOS transistor 245 is turned off in the word line driving circuit 240, an H level output of the inverter 243 is inputted to the DC voltage switch 241. As a result, the DC voltage switch 241 is activated and the voltages of the respective word lines WL are raised to a level $Vpp_R$ (=Vpp).

The voltage raising operation in the DC voltage switch 241 will now be briefly described. When the signal of the H level is inputted through the NMOS transistor 244, an NMOS transistor 241a is turned on and a gate voltage of an NMOS transistor 241b is raised. As a result, the NMOS transistor 241b is also turned on and an output voltage of the NMOS transistor 241a is fed back to the gate of the NMOS transistor 241a. On the other hand, the gate voltage of the NMOS transistor 241b is further raised by boosting of a capacitor 241c to which the clock pulses $\phi$ are supplied and the raised voltage is transmitted to the source of the transistor 241b. As a result, the gate voltage of the NMOS transistor 241a is also raised. The above described operation is repeated so that the voltages of the word lines WL are raised to the applied voltage Vpp.

On the other hand, the source line SL is maintained at zero volt since the NMOS transistor 34 is turned on in response to the mode signal $\overline{Pr}$.

Thus, all of the word lines WL are at Vpp, all of the bit lines BL are at zero volt, and the source line SL is at zero volt as shown in FIG. 5. As a result, a high electric field is generated between the drain region 6 and the floating gate 40 in FIG. 7. At this time, tunneling current flows through the thin oxide film 41, so that electrons are moved from the drain region 6 into the floating gate 40. Thus, electrons are stored in the floating gate 40 and accordingly the threshold voltage of the memory transistor viewed from the control gate 42 is increased compared with that prior to the erasing operation. This state is referred to as the "erase state" and a logic "1" is assigned to that state.

Writing Operation:

Operation in the write mode will be described hereinafter. In this write mode, outputs of the column decoder 21 are as follows: Only the output corresponding to a bit line to be selected is at the H level and the other outputs are all at the L level. Similarly, as for outputs of the row decoder 22, only the output corresponding to a word line to be selected is at the H level and the other outputs are all at the L level. In the I/O bus 32, the line corresponding to the selected bit line BL receives data of the H level through the I/O buffer 33. Thus, as for the I/O bus 32, only the I/O line corresponding to the selected bit line BL is at the H level and the other I/O lines are all at zero level.

The mode signal generating circuit 28 generates the mode signal Pr at the H level and the mode signal $\overline{Pr}$ at the L level. As a result, the voltage selection circuit 29 selects the output $\frac{1}{2}$.Vpp from the $\frac{1}{2}$.Vpp generating circuit 27 and supplies this output voltage to the word line driving circuit group 24.

In the above described state, the NMOS transistor 252 is turned on and the NMOS transistor 253 is turned off in the $\frac{1}{2}$.Vpp supply circuit 250. Accordingly, the power supply voltage Vcc is applied to the signal line 256 and an input signal to the DC voltage switch 251 is at the H level. Thus, the DC voltage switch 251 is activated and the output of the DC voltage switch 251, i.e. the voltage of the signal line 256, is raised to $\frac{1}{2}$.Vpp. The output voltage of the DC voltage switch 251 is strictly $\frac{1}{2}$.Vpp+Vth (Vth being the threshold voltage of the NMOS transistor 251b), due to a "back gate" effect of the NMOS transistor 251b. Thus, in order to cause the gate voltage of the NMOS transistor 257 to be $\frac{1}{2}$.Vpp+Vth, the NMOS transistor 257 is heavily conducted and the output voltage $\frac{1}{2}$.Vpp of the $\frac{1}{2}$.Vpp generating circuit 27 is applied to all of the bit lines BL with substantially no voltage drop. At this time, in the bit line supply circuit 230 connected to the selected bit line BL, the NMOS transistors 233, 234 and 235 are turned on and the NMOS transistor 232 is turned off. As a result, the clock pulses $\phi$ are supplied to the DC voltage switch 231 and the NMOS transistor 231a is turned on due to the voltage $\frac{1}{2}$.Vpp of the bit line BL. Accordingly, by the boosting effect of the capacitor 231c, the gate voltage of the NMOS transistor 231b is raised and the voltage is transmitted to the source of the NMOS transistor 231b, whereby the voltage of the bit line BL is raised. The above described operation is repeated until the voltage of the selected bit line BL is raised to Vpp. At the same time, in the bit line driving circuit 230, the output of the column decoder 21 is at the L level, whereby input of the clock pulses $\phi$ is stopped and the DC voltage switch 231 is not activated. As a result, the non-selected bit lines BL are maintained at the level $\frac{1}{2}$.Vpp through the $\frac{1}{2}$.Vpp supply circuit 250.

On the other hand, in the word line driving circuit 240 corresponding to the selected word line WL, the output of the row decoder 22 is at the H level and the NMOS transistor 244 is turned off while the NMOS transistor 245 is turned on. Accordingly, the output L of the inverter 242 is supplied to the DC voltage switch 241. As a result, the DC voltage switch 241 is not activated and the voltage of the selected word line WL is at the zero level. At the same time, in the word line driving circuit 240 corresponding to the non-selected word lines WL, the output of the row decoder 22 is at the L level and, accordingly, the output H of the inverter 242 is received by the DC voltage switch 241, whereby the DC voltage switch 241 is activated. As a result, the voltage of the non-selected word lines WL is raised to $Vpp_R = \frac{1}{2}.Vpp$.

In addition, since the mode signal Pr is at the L level, the NMOS transistor 34 is turned off and the source line SL is in a floating state.

As a result of the above described operation, the selected bit line BL2 is at Vpp; the selected word line WL1 is at zero level; the non-selected bit line BL2 and the non-selected word line WL2 are at $\frac{1}{2}.Vpp$; and the source line SL is in a floating state, as shown in FIG. 5. Consequently, in the selected memory transistor Q3, a high electric field is generated between the drain region 6 and the floating gate 40, causing tunneling current to flow through the thin oxide film 41, whereby the electrons stored in the floating gate 40 are moved into the drain region 6. Thus, the floating gate 40 is in a state depleted of electrons and the threshold voltage of the memory transistor Q3 viewed from the control gate 42 is lowered compared with the threshold voltage prior to the writing operation. This state is referred to as the write state and a logic "0" is assigned thereto. In the non-selected memory transistors Q1, Q2 and Q4, electric field between the floating gate 40 and the drain region 6 of each of them is about half of that of the selected memory transistor Q3 or zero and accordingly tunneling current is considered to be negligibly small and no change is caused in the threshold voltage.

In the foregoing, operation in the case of writing the logic "0" in the memory transistor Q3 was described as an example. The same operation is also performed in the case of writing the logic "0" in the other memory transistors. More specifically, the high voltage Vpp is applied only to a bit line connected to a selected memory transistor and zero volt is applied to the other bit lines. On the other hand, zero volt is applied only to a word line connected to the selected memory transistor and the intermediate voltage $\frac{1}{2}.Vpp$ is applied to the other word lines. As the intermediate voltage applied to the non-selected word lines, voltage $\frac{1}{2}.Vpp$, i.e. half of the high voltage Vpp is most preferred. However, any other value may be set as long as it is approximate to $\frac{1}{2}.Vpp$. It is to be noted in that case, however, that if the intermediate voltage is too close to zero volt or Vpp, tunneling current is increased in some of the non-selected memory transistors, causing erroneous operation.

Reading Operation:

Hereinafter, operation in the read mode will be described. In the read mode, a memory cell MC at a point of intersection between a word line WL receiving an output of the row decoder 22 at the H level and a bit line BL receiving an output of the column decoder 21 at the H level is selected in the same manner as in an ordinary EPROM. If a "1" is written in the selected memory cell MC, the memory transistor is not turned on and current does not flow in the related bit line BL. On the other hand, if a "0" is written in the selected memory cell MC, the memory transistor is turned on and current flows from the related bit line BL through the memory transistor, the source line SL and the transistor 34 (the NMOS transistor 34 being turned on since the mode signal $\overline{Pr}$ is at the H level). The above mentioned flow of the current is detected and amplified by the corresponding sense amplifier 31, whereby the information in the memory cell MC is read out.

Thus, in the above described embodiment, not only erasing operation but also writing operation can be performed by movement of electrons making use of electron tunneling. Therefore, erasing and writing operations can be performed by only the internal power supply without using an external power supply having a large current driving capacity. In addition, since the thin oxide film 41 is less deteriorated, the number of writing operations can be increased.

Figure 3:
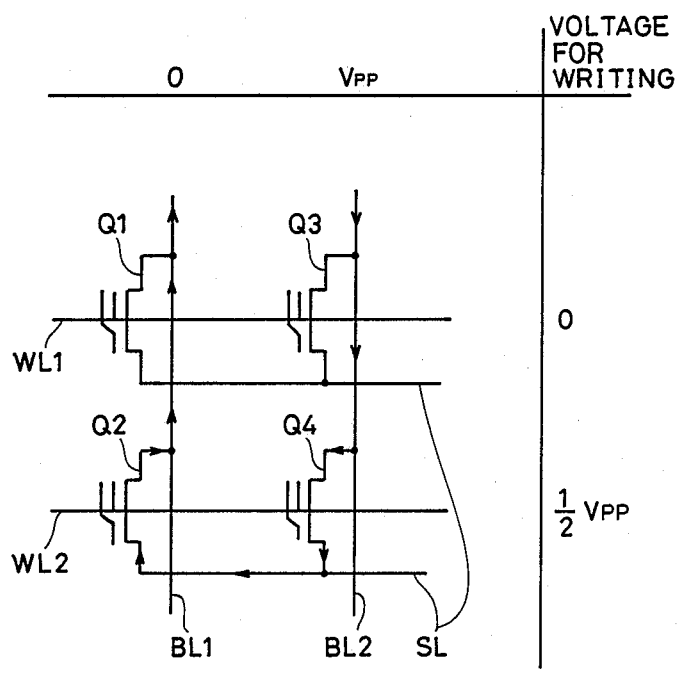
FIG. 3 is a diagram showing a circuit configuration of part of a memory cell array of another conventional nonvolatile semiconductor memory device and also showing voltages for writing to be applied to the electrodes.

Further, in the above described embodiment, the intermediate voltage $\frac{1}{2}.Vpp$ is applied to both of the non-selected word line WL2 and the non-selected bit line BL1 in the write mode. Accordingly, in this mode, the control gate and the drain of the non-selected memory transistor Q2 are maintained both at the intermediate voltage $\frac{1}{2}.Vpp$. Voltage almost equal to $\frac{1}{2}.Vpp$ is applied from the source of the memory transistor Q4 to the source of the memory transistor Q2. Accordingly, the memory transistor Q2 is in a non-conducting state between the source and the drain thereof and a current leakage path as in the conventional example in FIG. 3 is blocked by means of the memory transistor Q2. As a result, in the above described embodiment, undesired leakage current never flows in the write mode and writing operation can be performed by only the internal power supply having a small current driving capacity.

As described above, the present embodiment preferably uses the memory transistors of the structure shown in FIG. 7, for the following reasons. In the case of writing operation utilizing electron tunneling, the threshold voltage is determined by the electric field applied to the oxide film at the time of writing. On the other hand, the electric field is determined by a ratio of capacitances (i.e. a ratio of the capacitance between the control gate 42 and the floating gate 40 and the capacitance between the floating gate 40 and the drain region 6), and it is preferably constant irrespective of manufacturing process. However, in the case of the memory transistor of the structure shown in FIG. 2, the capacitance between the floating gate 9 and the drain region 6 is determined by a diffusion length in the transversal direction of the drain region 6 and it is difficult to control the capacitance. By contrast, in the case of the memory transistor shown in FIG. 7, a necessary capacitance value can be obtained easily by using the thin oxide film 41 only for the tunnel region. Accordingly, a stable threshold voltage can be obtained. If the above described advantage is not desired, memory transistors of the structure shown in FIG. 2 or other structure may be used.

Figure 9:
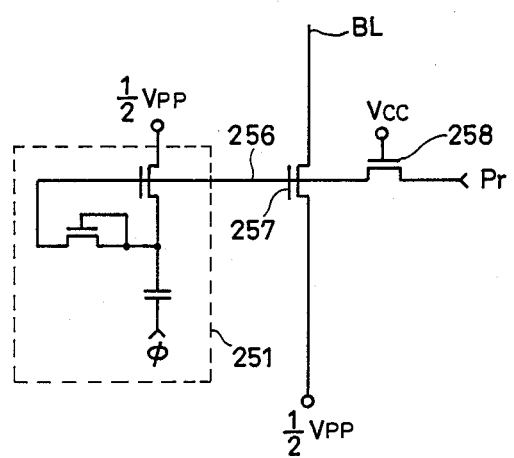
FIG. 9 is a circuit diagram showing another example of a $\frac{1}{2}$.Vpp supply circuit 250 shown in FIG. 6.

FIG. 9 is a circuit diagram showing another example of a $\frac{1}{2}.Vpp$ supply circuit 250 as shown in FIG. 6. In the example shown in FIG. 9, an NMOS transistor 258 is provided instead of the NMOS transistors 252 and 253 in FIG. 6. The output voltage Vcc of the internal power supply 37 is applied to the gate of the NMOS transistor 258 so that this transistor is always turned on. Accordingly, this NMOS transistor 258 supplies the mode signal Pr to the DC voltage switch 251 through the signal line 256. As a result, the DC voltage switch 251 is only activated when the mode signal Pr is at the H level, i.e. in the write mode. In the example of FIG. 9, the circuit configuration is simplified compared with the $\frac{1}{2}.Vpp$ supply circuit 250 shown in FIG. 6 and accordingly there is an advantage that the cost can be lowered.

Although $\frac{1}{2}.Vpp$ is applied to the DC voltage switch 251 in FIGS. 6 and 9, the output voltage Vpp of the Vpp generating circuit 26 may be applied thereto.

Although the embodiment was described by referring to a type in which all the memory transistors are simultaneously erased, the present invention is applicable to a nonvolatile semiconductor memory device having a so-called "page mode" in which erasing operation is performed for the memory transistors connected to an identical word line, for example. Such a nonvolatile semiconductor memory device in which erasing operation is performed for an identical word line is disclosed, for example, in the following documents: "A 64K EEPROM with Extended Temperature and Page Mode Operation" by Paul I. Suciu et al., ISSCC DIGEST OF TECHNICAL PAPERS, pp. 170–171, Feb. 1985; "Page Mode Programming 1Mb CMOS EPROM" by Takaaki Hagiwara et al., ISSCC DIGEST OF TECHNICAL PAPERS, pp. 174–175, Feb. 1985; and "Two 35ms 64K CMOS EEPROMs" by Richard Jolly et al., ISSCC DIGEST OF TECHNICAL PAPERS, pp. 172–173, Feb. 1985.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device formed on one chip of a semiconductor substrate in an integrated manner, said device having a plurality of word lines, a plurality of bit lines intersecting with said word lines, and a plurality of memory cells, each said memory cell being a single transistor-type cell provided at an intersection of said plurality of word lines and said plurality of bit lines for storing information in a nonvolatile manner, comprising:

an internal DC power supply provided on said semiconductor substrate, means for generating a high DC voltage for writing data into said memory cells and erasing the data written into said memory cells, said means for generating the high DC voltage comprising first voltage increasing means for increasing an output voltage of said internal DC power supply, means for generating an intermediate voltage higher than a ground voltage and lower than said high DC voltage, said means for generating the intermediate voltage comprising second voltage increasing means for increasing an output voltage of said internal DC power supply, addressing means for selecting a word line and a bit line intersecting at a selected memory cell, word line voltage applying means for applying said high DC voltage and one of said intermediate voltage and said ground voltage to said word lines dependent on an operation cycle of said nonvolatile semiconductor memory device, and bit line voltage applying means for applying said high DC voltage and one of said intermediate voltage and said ground voltage to said bit lines dependent on the operation cycle of said nonvolatile semiconductor memory device, said word line voltage applying means including word line write voltage applying means for applying said ground voltage to the word line selected by said addressing means and applying said intermediate voltage to the non-selected word lines in a write cycle of data into said memory cells, said bit line voltage applying means including bit line write voltage applying means for applying said high DC voltage to the bit line selected by said addressing means and applying said intermediate voltage to the non-selected bit lines in said write cycle.

2. A nonvolatile semiconductor memory device in accordance with claim 1, wherein
said memory cells each comprise a floating-gate transistor.

3. A nonvolatile semiconductor memory device in accordance with claim 2, wherein
said floating-gate transistor comprises
a source region and a drain region spaced apart within a semiconductor substrate,
a floating gate provided in an electrically floating state on said drain region and separated therefrom by an oxide film serving as a path of tunneling current, and
a control gate provided on said floating gate and separated therefrom by an oxide film and having a portion extending over said source region to incorporate integrally a selector gate,
said oxide film separating said floating gate and said drain region being thinner at least in portions thereof than said oxide film separating said control gate and said floating gate,
each said memory cell having said control gate connected to a word line intersecting therewith and said drain region connected to a bit line intersecting therewith.

4. A nonvolatile semiconductor memory device in accordance with claim 3, wherein
said high DC voltage is selected to have a value enabling flow of a sufficient amount of tunneling current, necessary for writing or erasing of data, between said drain region and said floating gate.

5. A nonvolatile semiconductor memory device in accordance with claim 1, wherein
said intermediate voltage is selected to have a value equal to about half of said high DC voltage.

6. A nonvolatile semiconductor memory device in accordance with claim 1, wherein
said word line voltage applying means further comprises word line erase voltage applying means for applying said high DC voltage to all of said word lines in an erase cycle of data written into said memory cells, and
said bit line voltage applying means further comprises bit line erase voltage applying means for applying said ground voltage to all of said bit lines into said erase cycle.

7. A nonvolatile semiconductor memory device in accordance with claim 6, wherein
said word line voltage applying means comprises first circuit means serving commonly as said word line write voltage applying means and as said word line erase voltage applying means, and
said bit line voltage applying means comprises second circuit means serving commonly bit line write voltage applying means and as said bit line erase voltage applying means.

8. A non volatile semiconductor memory device in accordance with claim 1, wherein each of said memory cells includes a gate electrode connected to a word line, a first electrode connected to a bit line, and a second electrode connected to a source line, wherein memory cells having gate electrodes connected to different word lines have second electrodes connected to a common source line.

9. A method for writing data in a nonvolatile semiconductor memory device having a plurality of word lines, a plurality of bit lines intersecting with said word lines, and a plurality of memory cells, each said memory cell being a single transistor-type cell provided at an intersection of said plurality of word lines and said plurality of bit lines for storing information in a nonvolatile manner, said memory device further having a single source line connected to a corresponding terminal of each of said memory cells, comprising:
for writing,
selecting a word line and a bit line intersecting with a selected memory cell,
applying a ground voltage to said selected word line,
applying a high DC voltage to said selected bit line, and
applying an intermediate voltage to non-selected word lines and bit lines, said intermediate voltage being higher than said ground voltage and lower than said high DC voltage, and
leaving floating said source line connected to each of said memory cells.

10. A method of writing data in a nonvolatile semiconductor memory device in accordance with claim 9, wherein
said memory cells each comprise a floating-gate transistor, and comprising the further step of, for erasing,
applying a ground voltage to each of said bit lines,
applying said high DC voltage to each of said word lines, and
applying said ground voltage to said single source line connected to said terminals of each of said memory cells.

11. A method of writing data in the nonvolatile semiconductor memory device in accordance with claim 10, wherein
said floating-gate transistor comprises
a source region and a drain region spaced apart from each other within a semiconductor substrate,
a floating gate provided in an electrically floating state on said drain region through an oxide film serving as a path of tunneling current, and
a control gate provided on said floating gate through an oxide film and having a portion extending over said source region to incorporate integrally a selector gate,
each said memory cell having said control gate connected to a word line intersecting therewith and said drain region connected to a bit line intersecting therewith.

12. A method of writing data in the nonvolatile semiconductor memory device in accordance with claim 11, wherein
said high DC voltage is selected to have a value enabling flow of a sufficient amount of tunneling current, necessary for writing or erasing data, between said drain region and said floating gate.

13. A method of writing data in the nonvolatile semiconductor memory device in accordance with claim 9, wherein
said intermediate voltage is selected to have a value substantially equal to approximately half of said high DC voltage.

14. A non-volatile semiconductor memory device comprising:
a plurality of memory cells arranged in rows and columns of a matrix, each of said memory cells having a first main electrode region of a second conductivity type on a semiconductor substrate of a first conductivity type, a second main electrode region of the second conductivity type formed on the surface of said substrate and between the surface and said first main electrode region and separated therefrom by first and second channel regions, a floating gate having a first portion formed on said first channel region of the substrate and separated therefrom by a first insulating film and a second portion formed on said first main electrode region and separated therefrom by a second insulating film thinner than the first insulating film, and a controlling gate having a first portion formed on said second channel region of the substrate and separated therefrom by a third insulating film and a second portion formed on said floating gate and separated therefrom by a fourth insulating film,
a plurality of word lines, each connected to each of the control gates of the memory cells arranged in each row,
first means for applying a first potential to all the word lines at a time of erasing, for applying a second potential to the word lines connected to selected memory cells and for applying a fourth potential intermediate between the second potential and a third potential to the remaining word lines at a time of writing,
a plurality of bit lines, each connected to each of said first main electrode regions of the memory cells arranged in each column, and second means for applying a fifth potential to all the bit lines at the time of erasing, said first means for applying operable for applying said third potential to the bit lines connected to the selected memory cells and applying said fourth potential to the remaining bit lines at the time of writing,
a plurality of lines for said second main electrode, each connected to said second main electrode regions of each of the memory cells arranged in each column, all of the lines for the second main electrode regions being made electrically floating.

15. A non-volatile semiconductor memory device in accordance with claim 14, wherein
said first potential and said third potential are substantially equal and said second potential and said fifth potential are the same.

16. A non-volatile semiconductor memory device in accordance with claim 14, wherein
said plurality of lines for the second main electrode are electrically connected to each other.

17. A memory cell of a non-volatile semiconductor memory device comprising:
a first main electrode region of a second conductivity type, connected to a corresponding bit line, formed on a surface of a substrate of a first conductivity type, a second main electrode region of the second conductivity type formed on the surface of said substrate and separated from said first main electrode region by first and second channel regions,
a floating gate having a first portion formed on said first channel region of the substrate and separated therefrom by a first insulating film and a second portion formed on said first main electrode region and separated therefrom by a second insulating film thinner than the first insulating film, said second portion of said floating gate having a depressed region, and a control gate having a first portion formed on said second channel region of the substrate and separated therefrom by a third insulating film and a second portion formed on said floating gate and separated therefrom by a fourth insulating film, said control gate having a projecting region opposite said depressed region of said second portion of said floating gate, said control gate being connected to the corresponding word line.

18. A method of operating a non-volatile semiconductor memory device including a plurality of memory cells in accordance with claim 17, wherein a first potential is applied to the control gate of all memory cells at a time of erasing, and, at a time of writing, a second potential is applied to a control gate of a selected memory cell and a fourth potential intermediate between the second potential and a third potential is applied to control gates of non-selected memory cells while the third potential is applied to said first main electrode region of the selected memory cell, and wherein a fifth potential is applied to said first main electrode region of said memory cells at the time of erasing, said second main region being made electrically floating at the time of writing, wherein said first potential and said third potential are the same and said second potential and said fifth potential are the same.

* * * * *